United States Patent
Lindh et al.

(10) Patent No.: US 12,316,148 B1
(45) Date of Patent: May 27, 2025

(54) DETECTION AND VERIFICATION OF DISCONNECTION OF A BATTERY FROM A BATTERY CHARGER

(71) Applicant: Micropower Group AB, Växjö (SE)

(72) Inventors: Jan Lindh, Växjö (SE); Isak Frank, Växjö (SE)

(73) Assignee: Micropower Group AB, Växjö (SE)

( * ) Notice: Subject to any disclaimer, the term of this patent is extended or adjusted under 35 U.S.C. 154(b) by 0 days.

(21) Appl. No.: 18/873,843

(22) PCT Filed: Jun. 19, 2023

(86) PCT No.: PCT/EP2023/066510
§ 371 (c)(1),
(2) Date: Dec. 11, 2024

(87) PCT Pub. No.: WO2024/002762
PCT Pub. Date: Jan. 4, 2024

(30) Foreign Application Priority Data

Jun. 29, 2022 (SE) .................................... 2250807-1

(51) Int. Cl.
*H02J 7/00* (2006.01)
*G01R 19/165* (2006.01)

(52) U.S. Cl.
CPC ...... *H02J 7/0036* (2013.01); *G01R 19/16571* (2013.01); *G01R 19/16576* (2013.01)

(58) Field of Classification Search
CPC ............. H02J 7/0036; G01R 19/16571; G01R 19/16576

(Continued)

(56) References Cited

U.S. PATENT DOCUMENTS

| 4,746,852 A | 5/1988 | Martin |
| 6,340,876 B1 | 1/2002 | Saint-Pierre |

(Continued)

FOREIGN PATENT DOCUMENTS

| CN | 204243737 U | 4/2015 |
| DE | 102018214449 A1 | 2/2020 |

(Continued)

OTHER PUBLICATIONS

Swedish Search Report for Swedish Application No. 2250807-1, dated Jun. 29, 2022, 3 pages.

(Continued)

*Primary Examiner* — Zixuan Zhou
(74) *Attorney, Agent, or Firm* — ALSTON & BIRD LLP

(57) ABSTRACT

A method for detecting whether a battery (110) is disconnected from a battery charger (120). The method comprises determining (S1) if the battery charger (120) is charging the battery (110), and obtaining (S2) a charger model indicative of a first expected output voltage ($U_{mod}$) of the battery charger (120) as a function of time when the battery charger (120) is connected to, but not charging, the battery (110). When it is determined that the battery charger (120) is not charging the battery (110), the method comprises: measuring (S3) a first measured output voltage ($U_{meas1}$) of the battery charger (120) as a function of time; and determining (S4) if the battery (110) is disconnected from the battery charger (120) based on whether the first measured output voltage ($U_{meas1}$) differs from the first expected output voltage ($U_{mod}$) by more than a first threshold value at one or more corresponding points of time.

14 Claims, 4 Drawing Sheets

(58) Field of Classification Search
USPC .......................................................... 320/165
See application file for complete search history.

(56) References Cited

U.S. PATENT DOCUMENTS

| | | | |
|---|---|---|---|
| 6,420,854 | B1 | 7/2002 | Hughes et al. |
| 8,994,323 | B2 * | 3/2015 | Nishida ................. H02J 7/0034 |
| | | | 320/108 |
| 2003/0020434 | A1 | 1/2003 | Fukuoka et al. |
| 2013/0043832 | A1 | 2/2013 | Yen |
| 2016/0257210 | A1 * | 9/2016 | Chen ......................... H02J 7/02 |

FOREIGN PATENT DOCUMENTS

| | | | |
|---|---|---|---|
| EP | 2375486 | A2 | 10/2011 |
| JP | H 0779534 | A | 3/1995 |
| WO | WO 2016/174854 | A1 | 11/2016 |

OTHER PUBLICATIONS

International Search Report and Written Opinion for Patent Cooperation Treaty Application No. PCT/EP2023/066510, dated Oct. 4, 2023, 12 pages.

\* cited by examiner

DETECTION AND VERIFICATION OF DISCONNECTION OF A BATTERY FROM A BATTERY CHARGER

CROSS REFERENCE TO RELATED APPLICATIONS

This application is a National Stage Application, filed under 35 U.S.C. § 371, of International Application No. PCT/EP2023/066510, filed Jun. 19, 2023, which international application claims priority to and the benefit of Swedish Application No. 2250807-1, filed Jun. 29, 2022; the contents of both of which as are hereby incorporated by reference in their entireties.

TECHNICAL FIELD

The present disclosure relates to a method for detecting and verifying disconnection of a battery from a battery charger, a control unit performing such a method, a battery charger comprising such a control unit, a computer program, and a computer readable medium.

BACKGROUND

A battery charger runs an electrical current through a battery to increase the state of charge of the battery. The charging can be performed in different ways depending on the type of battery. Common battery types are lead-acid based batteries, nickel-cadmium (Ni—Cd), nickel metal hydride (Ni-MH), and lithium-ion (Li-Ion). Common charging methods include constant voltage, constant current, and pulsed charge. A constant voltage charger provides a constant DC voltage to the battery and is commonly used for lead acid batteries and Li-Ion batteries. However, such battery chargers typically comprise additional circuitry for protecting the battery and any person handling the battery and battery charger. A constant current charger provides a constant current and is commonly used for Ni-CD and Ni-MH batteries. A pulsed charger provides charge current or voltage in pulses.

One important safety feature in a battery charger is battery detection, which lets the battery charger know if there is a battery present in the charger. It is desired to stop the charging if the battery is removed during charging since current is flowing from the output of the battery charger. It is also relevant to detect battery removal after charging is completed since potentially dangerous voltage levels can be maintained at the output of the battery charger after the battery has been removed. When disconnecting the battery during charging, the resulting abrupt reduction of output current can be detected easily. Such method, however, cannot be used if the battery charger is not actively charging the battery.

Therefore, there is a need for ways detecting disconnection of a battery from a battery charger when the battery charger is not actively charging the battery.

SUMMARY

It is an object of the present disclosure to provide ways detecting and verifying whether a battery has been disconnected from a battery charger. This object is at least in part achieved by a method for detecting whether a battery is disconnected a battery charger. The method comprises determining if the battery charger is charging the battery, and obtaining a charger model indicative of a first expected output voltage of the battery charger as a function of time when the battery charger is connected to, but not charging, the battery. When it is determined that the battery charger is not charging the battery, the method comprises: measuring a first measured output voltage of the battery charger as a function of time; and determining if the battery is disconnected from the battery charger based on whether the first measured output voltage differs from the first expected output voltage by more than a first threshold value as one or more corresponding points of time.

After charging of the battery is completed, the output voltage of the battery charger behaves differently versus time when the battery is connected to the battery charger and when it has been disconnected from the battery charger. Monitoring the output voltage and comparing it to an expected behavior therefore makes it possible to determine if the battery has been disconnected from the battery charger. For example, if the measured voltage deviates more than a predetermined amount, such as 1 V, from an expected voltage when the battery is connected to the battery charger but is not being charged, the battery has likely been disconnected from the battery charger. The disclosed method can be implemented in existing battery chargers with minimal modifications. For instance, physical changes to the battery charger are not required.

According to aspects, the charger model comprises one or more model parameters, and the method comprises, when it is determined that the battery charger is not charging the battery, measuring a preliminary measured output voltage of the battery charger as a function of time, and estimating at least one model parameter based on the preliminary measured output voltage. The model parameters are preferably estimated from a plurality of measurement points measured directly after it is detected that the battery charger has stopped charging the battery. By estimating the model parameters from measurements, a charger model tailored for a specific battery is obtained. Estimating the model parameters from measurements therefore makes the modeling more accurate. However, one or more model parameters may be predetermined.

According to aspects, the charger model comprises a model of an effective series resistor-capacitor circuit. It has been found that the dominating behavior of the discharging of the output voltage can be predicted well by the effective series resistor-capacitor circuit. This type of model thus provides an accurate prediction while requiring few model parameters, which is computationally efficient. Alternatively, the charger model comprises an empirical model.

According to aspects, the method comprises measuring an output current of the battery charger, wherein the battery charger is determined charging the battery if the measured output current is larger than a current threshold value. This is a simple yet effective way of determining if charging has stopped.

According to aspects, the battery charger comprises a first resistor arrangement arranged connectable across an output of the battery charger, where the method further comprises connecting the first resistor arrangement if the battery is determined disconnected from the battery charger. This enables a quicker discharge of a potentially dangerous voltage level maintained at the output of the battery charger after the battery has been disconnected. The first resistor arrangement is a connectable arrangement comprising one or more resistors, which is arranged to discharge a charge across the output of the battery charger. The first resistor arrangement is connectable across two terminals of the output of the battery charger.

According to aspects, the method further comprises: obtaining a second expected output voltage of the battery charger as a function of time when the first resistor arrangement has been connected; measuring a second measured output voltage of the battery charger as a function of time; and verifying if the battery is disconnected from the battery charger based on whether the second measured output voltage differs from the second expected output voltage by more than a second threshold value as one or more corresponding points of time. There is a possibility that the battery was incorrectly determined disconnected from the battery charger. Therefore, it can be relevant to verify the disconnection. Herein, verify means to determine a second time. After the first resistor arrangement has been connected, the output voltage of the battery charger behaves differently versus time whether or not the battery was actually disconnected or not. This can be used to verify the disconnection. For example, the change rate, i.e., time derivative, of the output voltage can be compared to a corresponding expected value. Alternatively, or in combination of, a single or averaged plurality of measurement points of the output voltage can be compared to a corresponding expected value.

According to aspects, the method further comprises disconnecting the first resistor arrangement if the verification indicates that the battery has not been disconnected from the battery charger. This way, the state of charge of the battery is not drained unnecessarily.

According to aspects, the battery charger comprises a first resistor arrangement arranged connectable across the output of the battery charger, the battery charger also comprising a filter arrangement arranged across the output of the battery charger, where the filter arrangement comprises a connectable second resistor arrangement which is arranged bypassed in an unconnected state when the battery charger is charging the battery, where the method further comprises connecting the first resistor arrangement and the second resistor arrangement if the battery is determined disconnected from the battery charger.

The filter arrangement is connected across two terminals of the output of the battery charger. The second resistor arrangement is a connectable arrangement comprising one or more resistors. The second resistor arrangement is arranged to prevent sparks when the battery is first connected to the battery charger. The second resistor arrangement is typically connected in series with the remainder of the filter arrangement. The output filter typically comprises a capacitor arrangement across the output of the battery charger. The capacitor arrangement may comprise one or more capacitors. As an example, the filter arrangement can comprise a single capacitor and the second resistor arrangement can comprise a single resistor connectable in series with that capacitor. The second resistor arrangement is arranged in a connected state when the battery is first put into the battery charger for charging. The second resistor arrangement is then arranged bypassed in an unconnected state when the battery charger is charging the battery to reduce losses. Connecting both the first and the second resistor arrangements after the battery has been deemed disconnected simplifies verification if the battery has been disconnected by monitoring the output voltage of the battery charger.

According to aspects, the method further comprises: obtaining a third expected output voltage of the battery charger as a function of time when the first resistor arrangement and the second resistor arrangement have been connected; measuring a third measured output voltage of the battery charger as a function of time; and verifying if the battery is disconnected from the battery charger based on whether the third measured output voltage differs from the third expected output voltage by more than a third threshold value at one or more corresponding points of time. After the first and second resistor arrangements have been connected, the output voltage of the battery charger behaves differently versus time whether or not the battery was actually disconnected or not. This can be used to verify the disconnection. For example, the change rate, i.e., time derivative, of the output voltage can be compared to a corresponding expected value. Alternatively, or in combination of, a single or averaged plurality of measurement points of the output voltage can be compared to a corresponding expected value.

According to aspects, the method further comprises disconnecting the first resistor arrangement and the second resistor arrangement if the verification indicates that the battery has not been disconnected from the battery charger. This way, the state of charge of the battery is not drained unnecessarily. If, on the other hand, the verification indicates that the battery has been disconnected from the battery charger, the method comprises disconnecting the first resistor arrangement. This way, the battery charger is ready for receiving a new battery to be charged.

There is also disclosed herein control units, computer programs, computer readable media, computer program products, and battery chargers associated with the above discussed advantages.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present disclosure will become apparent when studying the appended claims and the following description. The skilled person realizes that different features of the present disclosure may be combined to create embodiments other than those described in the following, without departing from the scope of the present disclosure.

BRIEF DESCRIPTION OF THE DRAWINGS

With reference to the appended drawings, below follows a more detailed description of embodiments of the present disclosure cited as examples. In the drawings.

DETAILED DESCRIPTION

Figure 1:
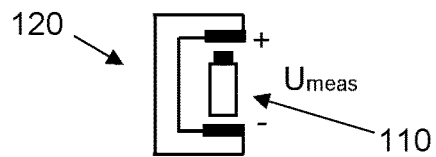
FIG. 1 shows a battery connected to a battery charger.

The present disclosure will now be described more fully hereinafter with reference to the accompanying drawings, in which certain aspects of the present disclosure are shown. This present disclosure may, however, be embodied in many different forms and should not be construed as limited to the embodiments and aspects set forth herein; rather, these embodiments are provided by way of example so that this disclosure will be thorough and complete, and will fully convey the scope of the present disclosure to those skilled in the art. Like numbers refer to like elements throughout the description.

It is to be understood that the present disclosure is not limited to the embodiments described herein and illustrated in the drawings; rather, the skilled person will recognize that many changes and modifications may be made within the scope of the appended claims.

FIG. 1 shows a battery 100 connected to a battery charger 120, where the voltage across the output of the battery charger is denoted $U_{meas}$. The output of the charger comprises a positive terminal and negative terminal, which are arranged to connect to corresponding terminals of the battery. When the battery charger is charging the battery, current is flowing from the output of the battery charger through the battery. A disconnection of the battery during charging can easily be detected since the disconnection causes an abrupt reduction of the output current from the battery charger, which in turn leads to a transient in the output voltage. However, such way of detecting a disconnection is not possible when the battery charger is not charging battery since the battery charger is not providing any current into the battery, or at least only inputting an insignificant amount. A disconnection of the battery from the battery charger means an electrical disconnection. A disconnection typically means that the battery is physically removed from the battery charger, by, e.g., a person. However, the battery can also remain in the battery charger and be disconnected by electrical switches.

The present disclosure is therefore based on comparing a measured output voltage of the battery charger 120 to an expected output voltage obtained from a charger model. A voltage is maintained at the output of the battery charger for a time after the battery charger has stopped charging the battery 110. This voltage, however, behaves differently versus time whether or not the battery is connected to the battery charger. This makes it possible to determine if the battery has been disconnected after the charging is completed. The charging is typically completed when the state of charge of the battery is full. However, charging may stop at any state of charge, e.g., if the battery charger is set to charge the battery for a fixed amount of time.

When the battery charger 120 is charging the battery 110, a charging voltage level is maintained at the output of the battery charger, and correspondingly across the battery. This charging voltage is typically higher than a target voltage of the battery. The higher voltage minimizes charging time. When the battery charger stops charging the battery, i.e., stops providing current into the battery, the output voltage of the battery charger is maintained by the battery as long as the battery is connected to the battery charger. This voltage starts at the charging voltage and is gradually decreased to the target voltage over time. The exact behavior of the output voltage in this scenario typically depends on the specific chemistry and construction of the battery. Here, behavior means how the voltage changes over time.

When the battery 110 is disconnected from the battery charger 120, internal circuitry of the battery charger maintains the voltage at the output of the battery charger for a time. The battery charger typically comprises an output filter arrangement, which normally is a low-pass filter comprising one or more capacitors. A low-pass filter attenuates transients that may arise from internal circuitry of the battery charger. The filter arrangement is arranged across the output of battery charger and filters voltages/currents between the battery charger and the battery. The one or more capacitors are charged when the battery charger is charging the battery and are discharged over time when battery is disconnected from the battery charger.

The voltage levels maintained at the output of the battery charger 120 after the battery 110 has been disconnected may present a safety risk for a person or equipment. Therefore, it can be desired to actively discharge the output of the battery charger after it has been determined that the battery has been disconnected from the battery charger to reduce the voltage levels across the output quicker. Such active discharge can be achieved by a first resistor arrangement. The first resistor arrangement is a connectable arrangement comprising one or more resistors, which is arranged to discharge a charge across the output of the battery charger. The first resistor arrangement can also be called a discharge arrangement.

The effective resistance of the first resistor arrangement is normally relatively low to enable fast discharge times. The effective resistance can be seen as the resistance of a single resistor modeling the first resistor arrangement (which may comprise a plurality of resistors). Here, relatively low means that a resulting current that would flow through the first resistor arrangement when the battery is still connected is high enough to potentially damage the first resistor arrangement. For this reason, the first resistor arrangement typically comprises several resistors arranged in parallel to reduce temperatures of the individual resistors. In any case, it is undesired to connect the first resistor arrangement if the battery is connected to the battery since current flowing through the first resistor arrangement in such scenario may still damage the first resistor arrangement. In addition, a connected first resistor arrangement will discharge a connected battery, i.e., drain the state of charge of the battery, which is undesired. It is therefore desired to accurately detect if a battery has been disconnected from the battery charger.

After the battery has stopped charging the battery, the different behavior of the output voltage of the battery charger 120 versus time when the battery 110 is and is not connected to the battery charger makes it possible to determine if the battery has been disconnected from the battery charger. More specifically, it possible to determine if a battery has been disconnected from the battery charger by comparing a measured output voltage of the battery charger to the expected voltage when the battery is connected to the battery charger but is not charging. This comparison is preferably done iteratively when the charging has stopped. For example, if the measured voltage deviates more than a predetermined amount from an expected voltage when the battery is connected to the battery charger, the battery has likely been disconnected from the battery charger.

Upon completing charging the battery 110, and when the battery is connected to the battery charger 120, the voltage across the battery, and correspondingly the voltage at the output of the battery charger, can, e.g., be modelled as discharge of an effective series resistor-capacitor circuit connected to an ideal battery with a target voltage (also called idle voltage). This effective circuit is a model of the internal structure and chemistry of the battery. The voltage of such circuit can be expressed as $U_{mod} = m + k*e^{-\tau * t}$, where m is a target voltage of the battery, k is a voltage drop from an initial voltage to the target voltage, t is time, and $\tau$ is a time constant modelled as $\tau = 1/(R_{eff}C_{eff})$, where $R_{eff}$ and $C_{eff}$ are an effective resistance and an effective capacitance, respectively, of the effective series resistor-capacitor circuit.

After the battery 110 has been disconnected from the battery charger 120, the voltage at the output of the battery charger will follow another discharge behavior.

Figure 3:
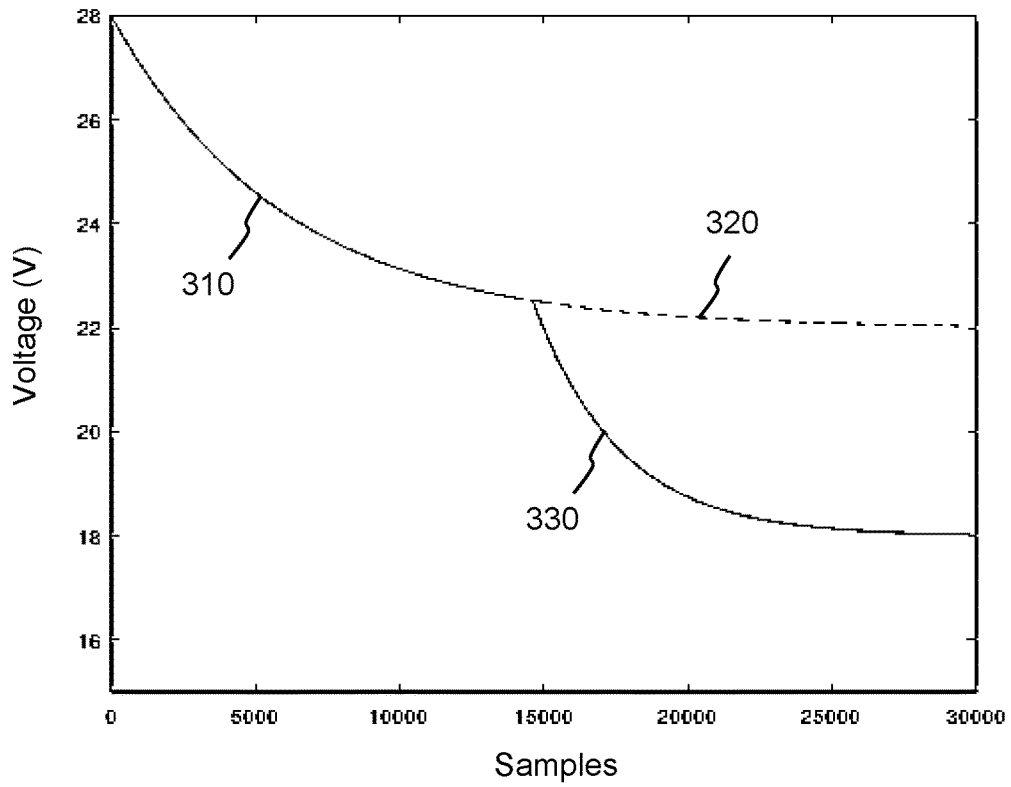
FIG. 3 is a plot illustrating output voltage of the battery charger versus samples.

FIG. 3 shows example voltages at the output of the battery charger 120 versus samples, which can also be called measurement points, at a sample rate of 3000 samples per second. In particular, 310 is a measured output voltage of the battery charger when the battery is connected to the battery charger. At sample 15000, the battery is disconnected from the battery charger, which causes a change in the behavior of the measured output voltage 330 of the battery charger. The dashed line 320 represents an expected behavior the output voltage would have had if the battery remained connected to the battery charger. A disconnection of the battery from the battery charger can be detected by monitoring the output voltage of the battery charger and detecting when the measured output voltage deviates from the expected behavior more than a threshold.

Figure 4:
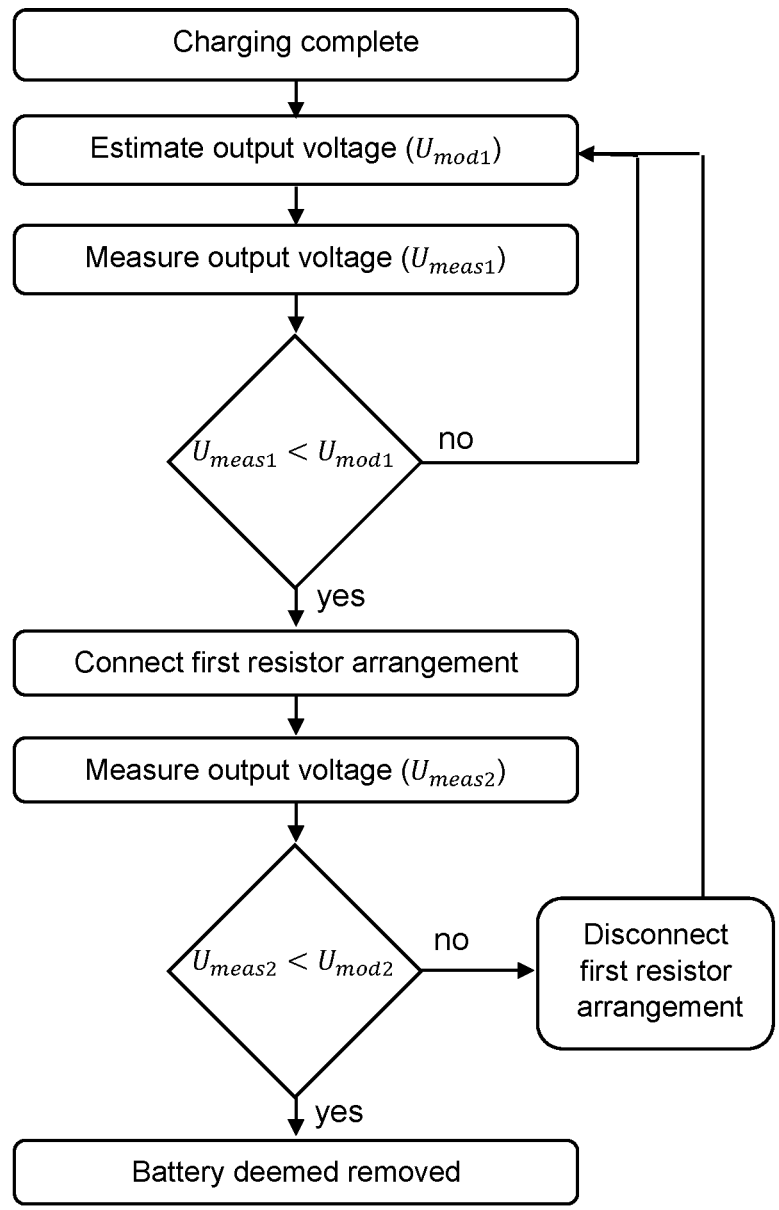
FIG. 4-6 are flow charts illustrating methods.

FIG. 4 shows a flow chart of an example embodiment of the disclosed method for detecting disconnection of a battery 110 from a battery charger 120. When it is detected that the battery charger 120 has stopped charging the battery, future values of the output voltage $U_{mod1}$ are estimated from a charger model which models the battery charger with the battery connected to it, and when the battery charger is not charging the battery. Thereafter, the output voltage $U_{meas1}$ of the battery charger is measured. The measured voltage is then compared to the expected values at a corresponding time instance. If the measured voltage is smaller than the expected value by a threshold value, the battery is deemed disconnected from the battery charger and the first resistor arrangement 122 is connected to the output of the battery charger to discharge the battery charger. If, on the other hand, the battery is deemed to be connected to the output of the battery charger, the output voltage can iteratively be monitored and compared to expected values. In that case, the charger model may or may not be updated. In this example, the comparison of the measured voltage and expected voltage comprises subtracting a measured voltage from an expected voltage (it can also be vice versa) and comparing it to a threshold value. However, the comparison may also, or alternatively, comprise comparing a fraction of the measured voltage over the expected voltage, or vice versa, to a threshold value. Furthermore, the comparison can alternatively, or in combination of, comprise of obtaining a difference between a time derivative of the measured voltage and a time derivative of the expected voltage, which is compared to a corresponding threshold.

If the detection of the battery disconnection was accurate, i.e., the battery 110 was actually disconnected from the battery charger 120, the output voltage of the battery will discharge over time and will typically drop to zero or close to zero after the first resistor arrangement has been connected. If, on the other hand, the detection was incorrect, i.e., the battery is in fact connected to the battery charger after the first resistor arrangement 122 has been connected, the battery voltage, and consequently the output voltage of the battery charger, will remain relatively constant. The different behavior of the output voltage when the battery has and has not been disconnected after the first resistor arrangement has been connected can be used to verify if the battery has in fact been disconnected from the battery charger after the first resistor arrangement has been connected.

Therefore, in the example of FIG. 4, the output voltage $U_{meas2}$ of the battery charger is measured after the first resistor arrangement has been connected to the output of the battery charger. If the measured voltage is smaller than an expected value by a threshold value, the disconnection of the battery can be confirmed. If, on the other hand, the measured voltage is larger than an expected value by a threshold value, it can be assumed that the battery was never disconnected in the first place. Here, the expected value represents an expected value of the output voltage when the first resistor arrangement has been connected. In this example, the comparison of the measured voltage and expected voltage comprises subtracting a measured voltage from an expected voltage (it can also be vice versa) and comparing it to a threshold value. However, the comparison may also, or alternatively, comprise comparing a fraction of the measured voltage over the expected voltage, or vice versa, to a threshold value. Furthermore, the comparison can alternatively, or in combination of, comprise of obtaining a difference between a time derivative of the measured voltage and a time derivative of the expected voltage, which is compared to a corresponding threshold. If it is determined that the battery is in fact still connected to the battery charger after the first resistor arrangement has been connected to the battery charger, the first resistor arrangement is disconnected and the method starts over. In that case, the charger model can be updated.

Figure 2:
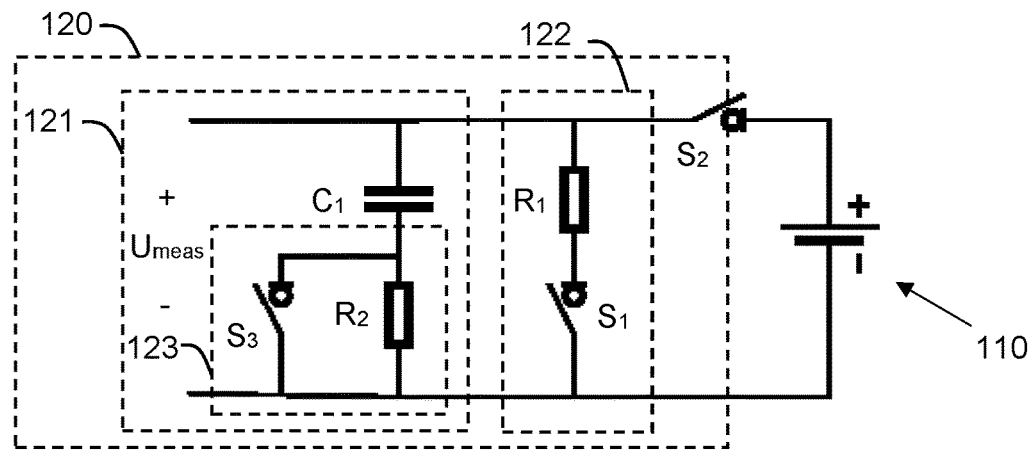
FIG. 2 schematically illustrates a circuit of a battery connected to a battery charger.

FIG. 2 shows a schematic illustration of an example battery charger 120 and battery 110. Here, the battery charger comprises an output filter 121. In this example, the output filter 121 is modelled as a capacitance $C_1$. The output filter comprises a connectable second resistor arrangement 123.

In general, the second resistor arrangement is a connectable arrangement comprising one or more resistors. The second resistor arrangement is arranged to prevent sparks when the battery is connected to the battery charger. The second resistor arrangement can also be called a soft-charge arrangement. The second resistor arrangement is typically connected in series with the remainder of the filter arrangement. The output filter typically comprises a capacitor arrangement across the output of the battery charger. The capacitor arrangement may comprise one or more capacitors. As an example, the filter arrangement can comprise a single capacitor and the second resistor arrangement can comprise a single resistor connectable in series with that capacitor. The second resistor arrangement is arranged in a connected state when the battery is first put into the battery charger for charging. The second resistor arrangement is then arranged bypassed in an unconnected state when the battery charger is charging the battery to reduce losses. Connecting both the first and the second resistor arrangements after the battery has been deemed disconnected makes it easy to verify if the battery has been disconnected by monitoring the output voltage of the battery charger.

Referring back to the example of FIG. 2, the second resistor arrangement is modelled as a switch $S_3$ and an effective resistance $R_2$. The effective resistance of the second resistor arrangement can be seen as the resistance of a single resistor modeling the second resistor arrangement (which may comprise a plurality of resistors). The connectable first resistor arrangement 122 is modelled as a switch $S_1$ and an effective resistance $R_1$. Battery connection and disconnection is modelled as a switch $S_2$. The battery is shown as an ideal battery for simplicity. The second resistor arrangement is arranged in a connected state, i.e., the switch $S_3$ is open, when the battery is first put into the battery charger for charging, which provides the sparks prevention when the battery is connected to the battery charger. The second resistor arrangement is arranged bypassed in an unconnected state, i.e., the switch $S_3$ is closed, when the battery charger 120 is charging the battery 110 to reduce losses.

With reference to the example of FIG. 2, during charging of the battery, switch $S_3$ is normally closed, i.e., the second resistor arrangement 123 is bypassed. Upon deeming that the battery 110 has been disconnected from the battery charger 120, the first and the second resistor arrangements 122, 123 are connected at the output of the battery charger, i.e., switch $S_1$ is closed and switch $S_3$ is opened. The output voltage of the battery charger will in that case behave differently whether or not the battery was actually disconnected or not. This can be used to verify the disconnection. The output voltage can be calculated as $$U_{meas} = \frac{R_1}{R_1 + R_2} U_{C1},$$

if the battery is disconnected from the battery charger, and $U_{meas}=U_{bat}$, if the battery connected to the battery charger, where $U_{bat}$ is the voltage across the battery and $U_{C1}$ is the voltage across $C_1$. Before the first and second resistor arrangements were connected, the voltage $U_{C1}$ was equal to the output voltage. Thus, $U_{meas}$ drops to half its value when the first and second resistor arrangements are connected if $R_1=R_2$ and if the battery is disconnected from the battery charger. If $R_1 \ll R_2$, the voltage $U_{meas}$ may become low enough to be affected by noise. If $R_2 \ll R_1$, the voltage drop $U_{meas}$ may be insignificant. If $0.1 < R_1/R_2 < 10$, for example, the voltage drop is significant and easy to detect.

Generally herein, the ratio of the effective resistance of first resistor arrangement over the effective resistance of second resistor arrangement may be larger than 0.1 and smaller than 10. Furthermore, if the battery 110 is connected to the battery charger 120 after the first and the second resistor arrangements 122, 123 have been connected, the battery voltage, and consequently the output voltage of the battery charger, will be relatively constant. If, on the other hand, the battery has in fact been disconnected, the filter arrangement will discharge over time. This different behavior of the output voltage can be used to verify if the battery has in fact been disconnected from the battery charger after the first resistor arrangement has been connected.

Figure 5:
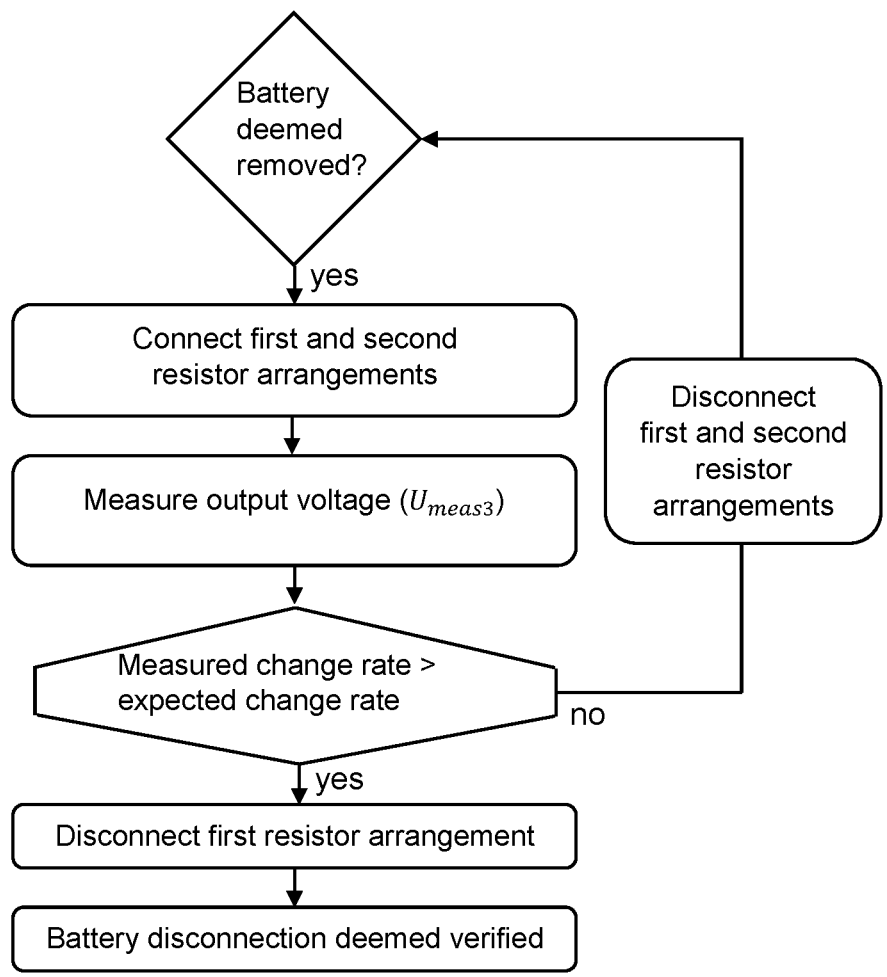

FIG. 5 shows a flow chart of an example of a disclosed method for verifying disconnection of a battery 110 from a battery charger 120. Herein, verify means to determine a second time. This method can be used as a complement to the method discussed in connection to FIG. 4. It may also be used together with other methods for detecting a possible disconnection of a battery from a battery charger.

In FIG. 5, the output voltage $U_{meas3}$ of the battery charger 120 is measured after the first and the second resistor arrangements 122, 123 have been connected to the output of the battery charger. If the time derivative of the measured voltage is smaller than a corresponding time derivative of an expected voltage by a threshold value, it can be assumed that the battery is still connected. If the time derivative of the measured voltage is larger than a corresponding time derivative of an expected voltage by a threshold value, it can be assumed that the battery has in fact been disconnected. Here, the expected value represents an expected value of the output voltage when the first and the second resistor arrangements have been connected. In this example, the comparison of the measured voltage and expected voltage is a difference of a time derivative of the measured voltage and a time derivative of the expected voltage, which is compared to a corresponding threshold. However, the comparison may also, or alternatively, comprise subtracting a measured voltage from an expected voltage, or vice versa, and comparing it to a threshold value, and/or comparing a fraction of the measured voltage over the expected voltage, or vice versa, to a threshold value.

Furthermore in FIG. 5, if it is determined that the battery 110 is in fact still connected to the battery charger 120 after the first and the second resistor arrangements 122, 123 have been connected to the battery charger, the first and the second resistor arrangements are disconnected and the method starts over. If it is determined that the battery has in fact been disconnected from the battery charger after the first and the second resistor arrangements have been connected to the battery charger, the first resistor arrangement is disconnected while the second resistor arrangement remains connected. This way, the battery charger is ready for receiving a new battery to be charged.

Figure 6:
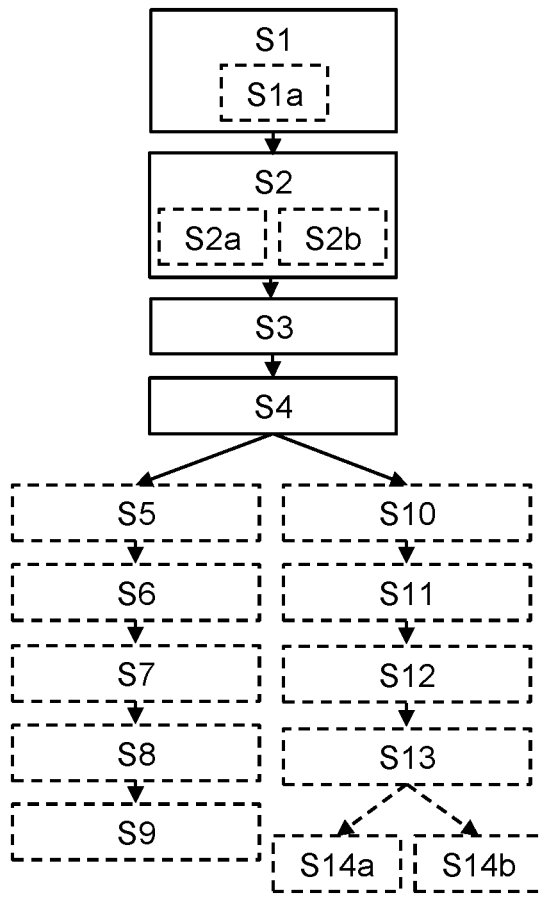

To summarize, with reference to FIG. 6, there is disclosed herein a method for detecting whether a battery 110 is disconnected from a battery charger 120. The method comprises determining S1 if the battery charger 120 is charging the battery 110. Determining if the battery charger is charging the battery is known in general and will only be discussed briefly herein.

For example, the disclosed method may comprise measuring S1a an output current of the battery charger 120. In that case, the battery charger 120 is determined charging the battery 110 if the measured output current is larger a current threshold value. The current threshold value may be predetermined before the battery charger 120 is deployed or before the battery charger 120 starts charging a battery. The measured output current can be compared to the threshold for a single sample. Alternatively, an averaged value of a plurality of samples can be compared to the threshold. The current threshold value can be based on the battery type and charging method.

The method also comprises obtaining S2 a charger model indicative of a first expected output voltage $U_{mod1}$ of the battery charger 120 as a function of time when the battery charger 120 is connected to, but not charging, the battery 110. The charger model may be obtained before or after it has been determined that the battery charger 120 is not charging the battery 110. When it is determined that the battery charger 120 is not charging the battery 110, the method further comprises: measuring S3a first measured output voltage $U_{meas1}$ of the battery charger 120 as a function of time; and determining S4 if the battery 110 is disconnected from the battery charger 120 based on whether the first measured output voltage $U_{meas1}$ differs from the first expected output voltage $U_{mod1}$ by more than a first threshold value at one or more corresponding points of time. The first measured output voltage may be measured in in a first set of one or more measurement points. Thus, the first expected output voltage may be compared to the first measured output voltage at corresponding time instances as the one or more measurement points in the first set. The first threshold value may be predetermined before the battery charger 120 is deployed or before the battery charger 120 starts charging a battery.

The first set of the output voltage $U_{meas1}$ of the battery charger 120 may comprise a single measurement point. This single point can be compared to a single value of the first expected output voltage $U_{mod1}$ at a corresponding time instance. However, the first set may comprise a plurality of measurement points at different instances that are compared to expected voltages at corresponding time instances. In that case, the comparisons at the different time instances may be averaged to a single value that is compared to the first threshold value. Alternatively, the comparisons at the different time instances may individually be compared to the first threshold value.

The difference between the measured output voltage $U_{meas1}$ in the first set and the first expected output voltage $U_{mod1}$ can be expressed as respective subtractions of one or more measurement points, in other words $U_{meas1}-U_{mod1}$. In other words, one or more measurement points at different time instances of the measured output voltage are subtracted from voltages at corresponding one or more time instances of the first expected voltage, or vice versa. If a plurality of measurement points are compared, the resulting differences form each measurement point may be averaged to a single value, which is compared to the first threshold value. In the case of a single measurement point or the averaged value, the first threshold value can be a voltage value such 2 V.

The difference between the measured output voltage $U_{meas1}$ in the first set and the first expected output voltage $U_{mod1}$ can be expressed as a fraction, such as $U_{meas1}/U_{mod1}$ or vice versa. Respective fractions can be obtained for one or more measurement points at different instances and corresponding one or more time instances of the first expected voltage. If a plurality of measurement points are compared, the resulting fractions for all measurement points may be averaged to a single value. In the case of a single measurement point or the averaged value, the first threshold value can be a percentage such 10%.

The difference between the measured output voltage $U_{meas1}$ in the first set and the first expected output voltage $U_{mod1}$ can also be expressed a difference in respective time derivatives, i.e., respective change rates of voltage over time. In that case, the first set comprises a plurality of measurement points. The difference in respective time derivatives can, e.g., be expressed as a subtraction or as a fraction, which is compared to a corresponding first threshold value. The time derivative at one or more time instances of the measured output voltage $U_{meas1}$ in the first set may be compared to time derivatives at corresponding one or more time instances of the first expected output voltage $U_{mod1}$.

The first threshold value can thus be, e.g., a voltage such as 2 V, a percentage such as 10%, or a time derivative voltage value, such as 2 V/s. The first threshold value can, e.g., be selected based on internal circuitry of the battery charger, battery type, or other battery characteristics.

As mentioned, the charger model may comprise a model of an effective series resistor-capacitor circuit. The effective series resistor-capacitor circuit models the internal structure and chemistry of the battery 110. Although the charger model may be modelled with more complex circuit models comprising additional components (such as capacitors, inductors, resistors), it has been found that the dominating behavior of the output voltage can be predicted well by the effective series resistor-capacitor circuit. This type of model thus provides an accurate prediction while requiring few model parameters.

The charger model does not necessarily have to be modeled as an effective circuit. The charger model can alternatively comprise an empirical model, such as a polynomial functions, splines etc. The empirical model may be predetermined before the battery charger 120 is deployed or before the battery charger 120 starts charging a battery.

The charger model may comprise one or more model parameters. Such model parameters can be the mentioned parameters m, k, τ if the model comprises the model of an effective series resistor-capacitor circuit mentioned above.

The model parameters can also be polynomial coefficients if the charger model is an empirical model comprising polynomial functions.

The models parameters can be predetermined. Alternatively, or in combination of, the method may comprise measuring S2a a preliminary measured output voltage $U_{pre}$ of the battery charger 120 as a function of time, and estimating S2b at least one model parameter based on the preliminary measured output voltage $U_{pre}$. The preliminary measured output voltage may be measured in a preliminary set of one or more measurement points. The one or more measurement points in the preliminary set are measured after it is determined that the battery charger 120 is not charging the battery 110. The model parameters are preferably estimated from a plurality of measurement points measured directly after it is detected that the battery charger has stopped charging the battery 110. By estimating one or more model parameters from measurements, a charger model tailored for a specific battery can be obtained. There may be many different batteries in rotation that are charged by the battery charger 120. Each of these different batteries may have different wear due to being charged and discharged a different amount of times, which make them discharge differently when left connected in the battery charger. Estimating the model parameters from measurements therefore makes the modeling more accurate. If, on the other hand, one or more of the model parameters have fixed predetermined values, some margin should preferably be considered when investigating if the measured output voltage is deviating from the expected voltage. For example, the battery may be deemed disconnected if $|U_{meas1}-U_{mod}|$ exceeds a first predetermined threshold value of 2 V if the model parameters are predetermined. If, on the other hand, one or more parameters are estimated from measurements according to the discussion above, the battery may be deemed disconnected if $|U_{meas1}-U_{mod}|$ exceeds a first threshold value of 0.2 V.

The estimation of model parameters from the measured preliminary measured output voltage $U_{pre}$ presents one way of enabling a time synchronization between measurements and estimated future values. In other words, the measurements can be compared to estimated future values at corresponding time instances. Alternatively, or in combination of, the charger model can be synchronized in time with the measured first set by using the time instance it is determined that the battery charger has stopped charging the battery as a reference. In that case, the model parameters may be predetermined. For example, the model can assume a starting value of the charging voltage of the battery 110, and model a discharge as soon as the charging stops. The measured first set is then accorded a time value representing time passed since the charging stopped.

As mentioned, the battery charger 120 may comprise a first resistor arrangement 122 arranged connectable across an output of the battery charger. In that case, the method may further comprise connecting S5 the first resistor arrangement 122 if the battery 110 is determined disconnected from the battery charger 120. The first resistor arrangement is disconnected when the battery charger is charging the battery. During connection, the first resistor arrangement is connected across the output of the battery charger that discharges the output.

The output voltage of the battery charger 120 can be measured after the first resistor arrangement 122 has been connected to the battery charger. If this measurement differs from a second expected voltage more than a second threshold value, the disconnection of the battery can be confirmed.

The second threshold value may be a second predetermined threshold value. In other words, the method may further comprise: obtaining S6 a second expected output voltage $U_{mod2}$ of the battery charger 120 as a function of time when the first resistor arrangement 122 has been connected; measuring S7 a second measured output voltage $U_{meas2}$ of the battery charger 120 as a function of time; and verifying S8 if the battery 110 is disconnected from the battery charger 120 based on whether the second measured output voltage $U_{meas2}$ differs from the second expected output voltage $U_{mod2}$ by more than a second threshold value as one or more corresponding points of time. The second measured voltage may be measured in a second set of one or more measurement points. In that case, the second expected output voltage is compared to the second measured output voltage at corresponding time instances as the one or more measurement points in the second set.

The second expected output voltage can represent a voltage when the battery is connected or when it has been disconnected. Since the output voltage is expected to discharge relatively fast when the first resistor arrangement has been connected and when the battery is disconnected, the second expected output voltage $U_{mod2}$ may, e.g., be equal to half the target voltage of the battery. If the measured voltage is not below such predetermined value by more than, e.g., 1 volt after some predetermined time, the battery can be assumed to be still connected to the charger. The output voltage is expected to remain relatively constant at the target voltage when the first resistor arrangement has been connected and when the battery is connected to the battery charger. If the measured voltage does not deviate from such predetermined value by more than, e.g., 1 volt after some predetermined time, the battery can be assumed to be still connected to the charger.

The difference between the measured output voltage $U_{meas2}$ in the second set and the second expected output voltage $U_{mod2}$ can, e.g., be expressed as a subtraction of one or more measurement points from corresponding one or values of the expected voltage, or vice versa, and/or be expressed as a fraction, such as $U_{meas2}/U_{mod2}$ or vice versa. In these two cases, the second set may comprise a plurality of measurement points at different instances. The difference between the measured output voltage $U_{meas2}$ in the second set and the second expected output voltage $U_{mod2}$ can also be a difference in respective time derivatives, i.e., respective change rates of voltage over time. In that case, the second set comprises a plurality of measurement points. The difference in respective time derivatives can, e.g., be expressed as a subtraction and/or as a fraction, which are compared to corresponding second threshold values.

The second threshold value can thus be, e.g., a voltage such as 2 V, a percentage such as 10%, or a time derivative voltage value, such as 2 V/s. The second threshold value can, e.g., be selected based on internal circuitry of the battery charger, battery type, or other battery characteristics.

If the verification of the disconnection of the battery shows that the battery 110 was not actually disconnected, i.e., if the verification indicates that the battery 110 has not been disconnected from the battery charger 120, the method may further comprise disconnecting S9 the first resistor arrangement 122. This way, the state of charge of the battery is not drained unnecessarily.

As mentioned, the output of the battery charger may comprise, in addition to a first resistor arrangement 122, a filter arrangement 121 with a connectable second resistor arrangement 123. The connectable second resistor arrangement 123 is arranged bypassed in an unconnected state when the battery charger 120 is charging the battery 110. The method may then further comprise connecting S10 the first resistor arrangement 122 and the second resistor arrangement 123 if the battery 110 is determined disconnected from the battery charger 120.

With the first resistor arrangement 122 and the second arrangement 123 connected, the method may further comprise: obtaining S11 a third expected output voltage $U_{mod3}$ of the battery charger 120 as a function of time when the first resistor arrangement 122 and the second resistor arrangement 123 have been connected; measuring S12 a third measured output voltage $U_{meas3}$ of the battery charger 120 as a function of time; and verifying S13 if the battery 110 is disconnected from the battery charger 120 based on whether the third measured output voltage $U_{meas3}$ differs from the third expected output voltage $U_{mod3}$ by more than a third threshold value at one or more corresponding points of time. The third measured output voltage may be measured in a third set of one or more measurement points. In that case, the third expected output voltage is compared to the third measured output voltage at corresponding time instances as the one or more measurement points in the third set. The third threshold value may be predetermined before the battery charger 120 is deployed or before the battery charger 120 starts charging a battery.

The third expected output voltage can represent a voltage when the battery is connected or when it has been disconnected. Since the output voltage is expected to discharge relatively fast when the first and the second resistor arrangements have been connected and when the battery is disconnected, the third expected output voltage $U_{mod3}$ may, e.g., be equal to half the target voltage of the battery. Furthermore, a voltage division between the first and the second resistor arrangements may result in the output voltage of the battery charger dropping quickly when first and the second resistor arrangements have been connected and when the battery is disconnected. Here, quickly is compared to an embodiment without only the first resistor arrangement and not the second resistor arrangement. If the measured voltage is not below such predetermined value by more than, e.g., 1 volt after some predetermined time, the battery can be assumed to be still connected to the charger. Here, the predetermined time may be shorter compared to an embodiment without only the first resistor arrangement and not the second resistor arrangement. The output voltage is expected to remain relatively constant at the target voltage when the first and the second resistor arrangements have been connected and when the battery is connected to the battery charger. If the measured voltage does not deviate from such predetermined value by more than, e.g., 1 volt after some predetermined time, the battery can be assumed to be still connected to the charger.

The difference between the measured output voltage $U_{meas3}$ in the third set and the third expected output voltage $U_{mod3}$ can, e.g., be expressed as a subtraction of one or more measurement points from corresponding expected values, or vice versa, and/or be expressed as a fraction, such as $U_{meas3}/U_{mod3}$ or vice versa. In these two cases, third set may comprise a plurality of measurement points at different time instances. The difference between the measured output voltage $U_{meas3}$ in the third set and the third expected output voltage $U_{mod3}$ can also be a difference in respective time derivatives, i.e., respective change rates of voltage over time. In that case, the third set comprises a plurality of measurement points. The difference in respective time derivatives can, e.g., be expressed as a subtraction and/or as a fraction, which are compared to corresponding third threshold values.

The third threshold value can thus be, e.g., a voltage such as 2 V, a percentage such as 10%, or a time derivative voltage value, such as 2 V/s. The third threshold value can, e.g., be selected based on internal circuitry of the battery charger, battery type, or other battery characteristics.

The method may further comprise disconnecting S14a the first resistor arrangement 122 and the second resistor arrangement 123 if the verification indicates that the battery 110 has not been disconnected from the battery charger 120. This way, the state of charge of the battery is not drained unnecessarily. If, on the other hand, the verification indicates that the battery has been disconnected from the battery charger, the method comprises disconnecting the first resistor arrangement. This way, the battery charger is ready for receiving a new battery to be charged.

Figure 7:
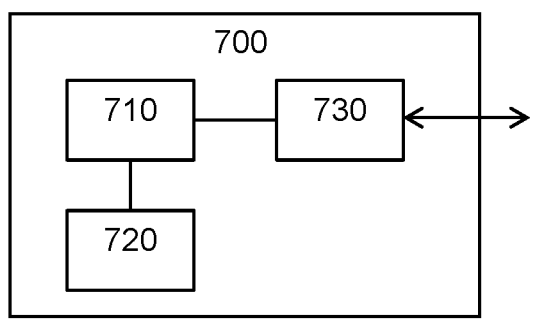
FIG. 7 schematically illustrates a control unit.

FIG. 7 schematically illustrates, in terms of a number of functional units, the components of a control unit 700 according to embodiments of the discussions herein. This control unit 700 may be comprised in the battery charger 120. Processing circuitry 710 is provided using any combination of one or more of a suitable central processing unit CPU, multiprocessor, microcontroller, digital signal processor DSP, etc., capable of executing software instructions stored in a computer program product, e.g. in the form of a storage medium 730. The processing circuitry 710 may further be provided as at least one application specific integrated circuit ASIC, or field programmable gate array FPGA.

Particularly, the processing circuitry 710 is configured to cause the control unit 700 to perform a set of operations, or steps, such as the methods discussed in connection to FIG. 6. For example, the storage medium 730 may store the set of operations, and the processing circuitry 710 may be configured to retrieve the set of operations from the storage medium 730 to cause the control unit 700 to perform the set of operations. The set of operations may be provided as a set of executable instructions. Thus, the processing circuitry 710 is thereby arranged to execute methods as herein disclosed.

The storage medium 730 may also comprise persistent storage, which, for example, can be any single one or combination of magnetic memory, optical memory, solid state memory or even remotely mounted memory.

The control unit 700 may further comprise an interface 720 for communications with at least one external device. As such the interface 720 may comprise one or more transmitters and receivers, comprising analogue and digital components and a suitable number of ports for wireline or wireless communication.

The processing circuitry 710 controls the general operation of the control unit 700, e.g., by sending data and control signals to the interface 720 and the storage medium 730, by receiving data and reports from the interface 720, and by retrieving data and instructions from the storage medium 730. Other components, as well as the related functionality, of the control node are omitted in order not to obscure the concepts presented herein.

Figure 8:
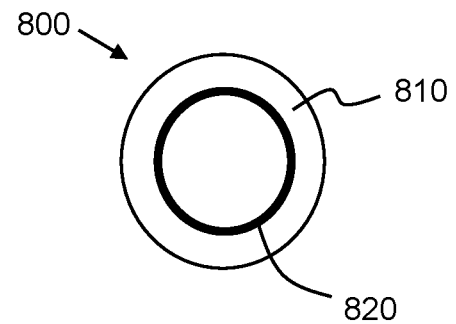
FIG. 8 shows an example computer program product.

FIG. 8 illustrates a computer readable medium 810 carrying a computer program comprising program code means 820 for performing the methods illustrated in FIG. 6, when said program product is run on a computer. The computer readable medium and the code means may together form a computer program product 800.

The invention claimed is:

1. A method for detecting whether a battery (110) is disconnected from a battery charger (120), the method comprising the steps of:
   determining (S1) if the battery charger (120) is charging the battery (110),
   obtaining (S2) a charger model indicative of a first expected output voltage ($U_{mod1}$) of the battery charger (120) as a function of time when the battery charger (120) is connected to, but is not charging, the battery (110), and
   upon determining that the battery charger (120) is not charging the battery (110):
      measuring (S3) a first measured output voltage ($U_{meas1}$) of the battery charger (120) as a function of time; and
      determining (S4) if the battery (110) is disconnected from the battery charger (120) based on whether the first measured output voltage ($U_{meas1}$) differs from the first expected output voltage ($U_{mod1}$) by more than a first threshold value at one or more corresponding points of time.

2. The method according to claim 1, wherein:
   the charger model comprises one or more model parameters (m, k, τ), and
   the method further comprises, upon determining that the battery charger (120) is not charging the battery (110), measuring (S2a) a preliminary measured output voltage ($U_{pre}$) of the battery charger (120) as a function of time, and estimating (S2b) at least one model parameter based on the preliminary measured output voltage ($U_{pre}$).

3. The method according to claim 1, wherein the charger model comprises a model of an effective series resistor-capacitor circuit.

4. The method according to claim 1, wherein the charger model comprises an empirical model.

5. The method according to claim 1, comprising measuring (S1a) an output current of the battery charger (120), wherein the battery charger (120) is determined charging the battery (110) if the measured output current is larger than a current threshold value.

6. The method according to claim 1, wherein the battery charger (120) comprises a first resistor arrangement (122) arranged connectable across an output of the battery charger, where the method further comprises connecting (S5) the first resistor arrangement (122) if the battery (110) is determined disconnected from the battery charger (120).

7. The method according to claim 6, further comprising: obtaining (S6) a second expected output voltage ($U_{mod2}$) of the battery charger (120) as a function of time when the first resistor arrangement (122) has been connected; measuring (S7) a second measured output voltage ($U_{meas2}$) of the battery charger (120) as a function of time; and verifying (S8) if the battery (110) is disconnected from the battery charger (120) based on whether the second measured output voltage ($U_{meas2}$) differs from the second expected output voltage ($U_{mod}$) by more than a second threshold value at one or more corresponding points of time.

8. The method according to claim 7, further comprising disconnecting (S9) the first resistor arrangement (122) if the verification indicates that the battery (110) has not been disconnected from the battery charger (120).

9. The method according to claim 1, wherein the battery charger (120) comprises a first resistor arrangement (122) arranged connectable across the output of the battery charger, the battery charger also comprising a filter arrangement (121) arranged across the output of the battery charger, where the filter arrangement (121) comprises a connectable second resistor arrangement (123) which is arranged bypassed in an unconnected state when the battery charger (120) is charging the battery (110), where the method further comprises connecting (S10) the first resistor arrangement (122) and the second resistor arrangement (123) if the battery (110) is determined disconnected from the battery charger (120).

10. The method according to claim 9, further comprising obtaining (S11) a third expected output voltage ($U_{mod3}$) of the battery charger (120) as a function of time when the first resistor arrangement (122) and the second resistor arrangement (123) have been connected; measuring (S12) a third measured output voltage ($U_{meas3}$) of the battery charger (120) as a function of time; and verifying (S13) if the battery (110) is disconnected from the battery charger (120) based on whether the third measured output voltage ($U_{meas3}$) differs from the third expected output voltage ($U_{mod}$) by more than a third threshold value at one or more corresponding points of time.

11. The method according to claim 10, further comprising disconnecting (S14*a*) the first resistor arrangement (122) and the second resistor arrangement (123) if the verification indicates that the battery (110) has not been disconnected from the battery charger (120), or disconnecting (S14*b*) the first resistor arrangement (122) if the verification indicates that the battery (110) has been disconnected from the battery charger (120).

12. A control unit (700) comprising processing circuitry (710) configured to perform the steps of claim 1.

13. A battery charger (120) comprising the control unit according claim 12.

14. A non-transitory computer readable medium (810) carrying computer executable program instructions (820) comprising program code means for performing the steps of claim 1 when said executable program instructions are run on a computer or on processing circuitry (710) of a control unit (700).

* * * * *

UNITED STATES PATENT AND TRADEMARK OFFICE
CERTIFICATE OF CORRECTION

PATENT NO. : 12,316,148 B1
APPLICATION NO. : 18/873843
DATED : May 27, 2025
INVENTOR(S) : Jan Lindh et al.

Page 1 of 1

It is certified that error appears in the above-identified patent and that said Letters Patent is hereby corrected as shown below:

In the Claims

In Column 18, Line 12, Claim 13, delete "according claim" and insert -- according to claim --, therefor.

Signed and Sealed this
Ninth Day of September, 2025

Coke Morgan Stewart
*Acting Director of the United States Patent and Trademark Office*